United States Patent
Houston

(10) Patent No.: US 7,453,743 B2
(45) Date of Patent: Nov. 18, 2008

(54) STATIC RANDOM ACCESS MEMORY DEVICE HAVING REDUCED LEAKAGE CURRENT DURING ACTIVE MODE AND A METHOD OF OPERATING THEREOF

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/875,225

(22) Filed: Oct. 19, 2007

(65) Prior Publication Data

US 2008/0043542 A1    Feb. 21, 2008

Related U.S. Application Data

(63) Continuation of application No. 10/733,038, filed on Dec. 11, 2003, now Pat. No. 7,333,357.

(51) Int. Cl.
*G11C 5/14* (2006.01)

(52) U.S. Cl. .............. 365/189.09; 365/226; 365/229; 365/189.04; 365/230.06

(58) Field of Classification Search ........... 365/226, 365/229, 189.04, 230.06, 189.09
See application file for complete search history.

(56) References Cited

U.S. PATENT DOCUMENTS

| | | |
|---|---|---|
| 4,916,670 A | 4/1990 | Suzuki et al. |
| 5,191,553 A | 3/1993 | Mizoguchi et al. |
| 5,298,816 A | 3/1994 | Kaplinsky |
| 5,508,957 A | 4/1996 | Momodomi et al. |
| 5,541,883 A | 7/1996 | Devanney |
| 5,596,286 A | 1/1997 | Houston |
| 5,615,162 A | 3/1997 | Houston |
| 5,734,604 A | 3/1998 | Akamatsu et al. |
| 5,757,689 A | 5/1998 | Seno |
| 5,771,190 A | 6/1998 | Okamura |
| 5,781,031 A | 7/1998 | Bertin et al. |
| 5,936,892 A | 8/1999 | Wendell |
| 6,011,719 A | 1/2000 | Wang et al. |
| 6,046,957 A | 4/2000 | Shyu |
| 6,137,732 A | 10/2000 | Inaba |
| 6,188,628 B1 | 2/2001 | Tomotani |
| 6,512,687 B1 * | 1/2003 | Chen et al. ............ 365/145 |
| 6,611,451 B1 | 8/2003 | Houston |
| 6,735,143 B2 | 5/2004 | Houston |
| 6,795,332 B2 | 9/2004 | Yamaoka et al. |
| 6,922,370 B2 | 7/2005 | Deng et al. |
| 6,925,025 B2 | 8/2005 | Deng et al. |
| 7,027,346 B2 | 4/2006 | Houston et al. |
| 7,039,818 B2 | 5/2006 | Deng et al. |

* cited by examiner

*Primary Examiner*—Thong Q Le
(74) *Attorney, Agent, or Firm*—Frank D. Cimino; W. James Brady; Frederick J. Telecky, Jr.

(57) ABSTRACT

An Static Random Access Memory (SRAM) device and a method of operating the same. In one embodiment, the SRAM device includes: (1) an SRAM array coupled to row peripheral circuitry by a word line and coupled to column peripheral circuitry by bit lines and (2) an array low voltage control circuitry that provides an enhanced low operating voltage $V_{ESS}$ to the SRAM array during at least a portion of an active mode thereof.

25 Claims, 2 Drawing Sheets

STATIC RANDOM ACCESS MEMORY DEVICE HAVING REDUCED LEAKAGE CURRENT DURING ACTIVE MODE AND A METHOD OF OPERATING THEREOF

This is a continuation of application Ser. No. 10/733,038, filed Dec. 11, 2003 now U.S. Pat. No. 7,333,357, the entire contents of which are incorporated herein by reference.

TECHNICAL FIELD OF THE INVENTION

The present invention is directed, in general, to memory devices and, more specifically, to a Static Random Access Memory (SRAM) device having reduced leakage current during active mode and a method of operating thereof.

BACKGROUND OF THE INVENTION

Memory devices are well known in the art and used in, among other things, virtually all microprocessor and digital signal processor (DSP) applications. One type of memory favored for many applications is Static Random Access Memory (SRAM). SRAM devices are fast and easy to use relative to many other types of memory devices. In addition, SRAM devices using metal-oxide-semiconductor (MOS) technology exhibit relatively low standby power and do not require a refresh cycle to maintain stored information. These attributes make SRAM devices particularly desirable for battery-powered equipment, such as laptop computers and personal digital assistants.

Miniaturization of SRAM devices is another attribute that may make SRAM devices desirable for such battery-powered equipment. Desired miniaturization, however, may include undesirable operating problems for the smaller SRAM devices. For example, current leakage may increase as the size of SRAM devices decreases. Current leakage may provide a problem during a sleep mode, a standby mode and even during an active mode. In fact, current leakage, which may be represented by $I_{DDQ}$, has become a greater concern during the active mode as SRAM devices continue to decrease in size.

Some options to reduce current leakage during the active mode already exists. In one such option, for example, the high operating voltage, $V_{DD}$, supplied to the SRAM device may be reduced to lower the voltage across the SRAM array. A reduced high operating voltage $V_{DD}$, however, can also reduce static noise margin (SNM) and write trip voltage (so-called "$V_{trip}$") below acceptable levels. Alternatively, a low operating voltage, $V_{SS}$, supplied to the SRAM device can be raised while in a standby mode and lowered when in the active mode. This alternative, unfortunately, requires more switching power and does not support the write trip voltage $V_{trip}$.

A high $V_{trip}$ and SNM are desired cell characteristics of SRAM devices. A high SNM is desired for circuit stability. If SNM is too low, READ operations may be disrupted. A high $V_{trip}$ is desired for adequate data write speed. If $V_{trip}$ is too low, WRITE operations may be disrupted. Unfortunately, the requirements for an acceptable SNM and write trip voltage $V_{trip}$ may limit the tolerances for an acceptable SRAM yield during manufacturing since increasing one typically decreases the other.

A typical six-transistor SRAM memory cell (the basic unit of a SRAM device) consists of two p-channel "pull-up" transistors, two n-channel "pull-down" transistors and two access transistors, which are typically n-channel transistors. The strength of the p-doped and n-doped channels of the transistors affects the performance of the SRAM memory cell as a whole. For example, a strong n-channel can cause SNM to be unsuitably low, particularly when accompanied by a weak p-channel. One might be tempted to weaken the n-channel and/or strengthen the p-channel to achieve a satisfactory SNM. However, a weak n-channel can cause $V_{trip}$ to be unsuitably low, particularly when accompanied by a strong p-channel.

Thus, existing SRAM devices are challenged by the competing and contradicting objectives of providing a weak n-channel (and/or a strong p-channel) to achieve an acceptable SNM and providing a strong n-channel (and/or a weak p-channel) to achieve an acceptable $V_{trip}$. Moreover, this trade-off between SNM and $V_{trip}$ (and, thus, between reliable READ and WRITE operations) becomes increasingly constrained with continued miniaturization and lower operating voltages since these amplify the effect of normal manufacturing variations.

Even though both SNM and $V_{trip}$ are degraded when the high operating voltage $V_{DD}$ is reduced, a reduction of the high operating voltage $V_{DD}$ is often desirable for low power operation and for some test conditions. Though both SNM and $V_{trip}$ are degraded, the degradation of $V_{trip}$ is particularly strong with a reduction in the high operating voltage $V_{DD}$. Thus $V_{trip}$ tends to limit the lower bound of the high operating voltage $V_{DD}$ for operation. A solution for reducing current leakage during an active mode, therefore, needs to provide a minimum adverse affect on SNM and $V_{trip}$.

Accordingly, what is needed in the art is an improved SRAM device having reduced current leakage during an active mode. Additionally, the improved SRAM device with reduced current leakage needs a strong SNM and write trip voltage $V_{trip}$.

SUMMARY OF THE INVENTION

To address the above-discussed deficiencies of the prior art, the present invention provides an SRAM device and a method of operating thereof. In one embodiment, the SRAM device includes (1) an SRAM array coupled to row peripheral circuitry by a word line and coupled to column peripheral circuitry by bit lines and (2) an array low voltage control circuitry that provides an enhanced low operating voltage $V_{ESS}$ to the SRAM array during at least a portion of an active mode thereof.

The present invention, therefore, may provide a greater power savings and a better SNM and write trip voltage $V_{trip}$ trade-off than existing SRAM devices allowing a wider process margin. Providing the enhanced low operating voltage $V_{ESS}$ reduces current leakage $I_{DDQ}$ by lowering voltage across the memory cell and raising the threshold voltage $V_{tn}$ due to a back bias effect since the enhanced low operating voltage $V_{ESS}$ is greater than a substrate voltage (typically the low operating voltage $V_{SS}$). The SNM may be improved by the higher $V_{tn}$ from the back bias effect that adequately compensates for the lowering of the SNM by a reduced cell voltage. With an improved SNM, cells may suffer a minimum of upset when the associated word line voltage is raised for access, as in a READ, or for non-addressed columns in an accessed row for WRITE. Similarly, the improved SNM may allow WRITE operations without upsetting cells in unaddressed columns.

A down side to the enhanced low operating voltage $V_{ESS}$ may be a reduction in the read current $I_{read}$. $I_{read}$, however, may be restored by providing the enhanced low operating voltage $V_{ESS}$ at a lower value for addressed columns during a READ operation. The present invention may also provide the enhanced low operating voltage $V_{ESS}$ at a lower value for READ operations than for WRITE operations. Additionally, the enhanced low operating voltage $V_{ESS}$ may be set to compensate for process variations by, for example, providing the enhanced low operating voltage $V_{ESS}$ at a higher value for process corners where failures of the SNM and the write trip voltage $V_{trip}$ may occur. The enhanced low operating voltage $V_{ESS}$ may also be provided at a higher value when the write trip voltage $V_{trip}$ is at a worst case. Furthermore, the enhanced low operating voltage $V_{ESS}$ may be provided at a higher value for low voltage operations, such as, during testing.

Thus, the enhanced low operating voltage $V_{ESS}$ may be defined at distinct values based on certain factors, such as, transistor parameters or modes of operations. For example, one enhanced low operating voltage $V_{ESS}$ value may be established for a test operation. Additionally, different enhanced low operating voltage $V_{ESS}$ values may be established for a READ operation or a WRITE operation. In some embodiments, a single enhanced low operating voltage $V_{ESS}$ value may be established for more than one factor. Therefore, a single enhanced low operating voltage $V_{ESS}$ value may be provided for a TEST, WRITE or READ operation.

In another aspect, the present invention provides a method of operating an SRAM device including (1) employing in an integrated circuit an SRAM array coupled to row peripheral circuitry by a word line and coupled to column peripheral circuitry by bit lines and (2) providing an enhanced low operating voltage $V_{ESS}$ to the SRAM array during at least a portion of an active mode.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
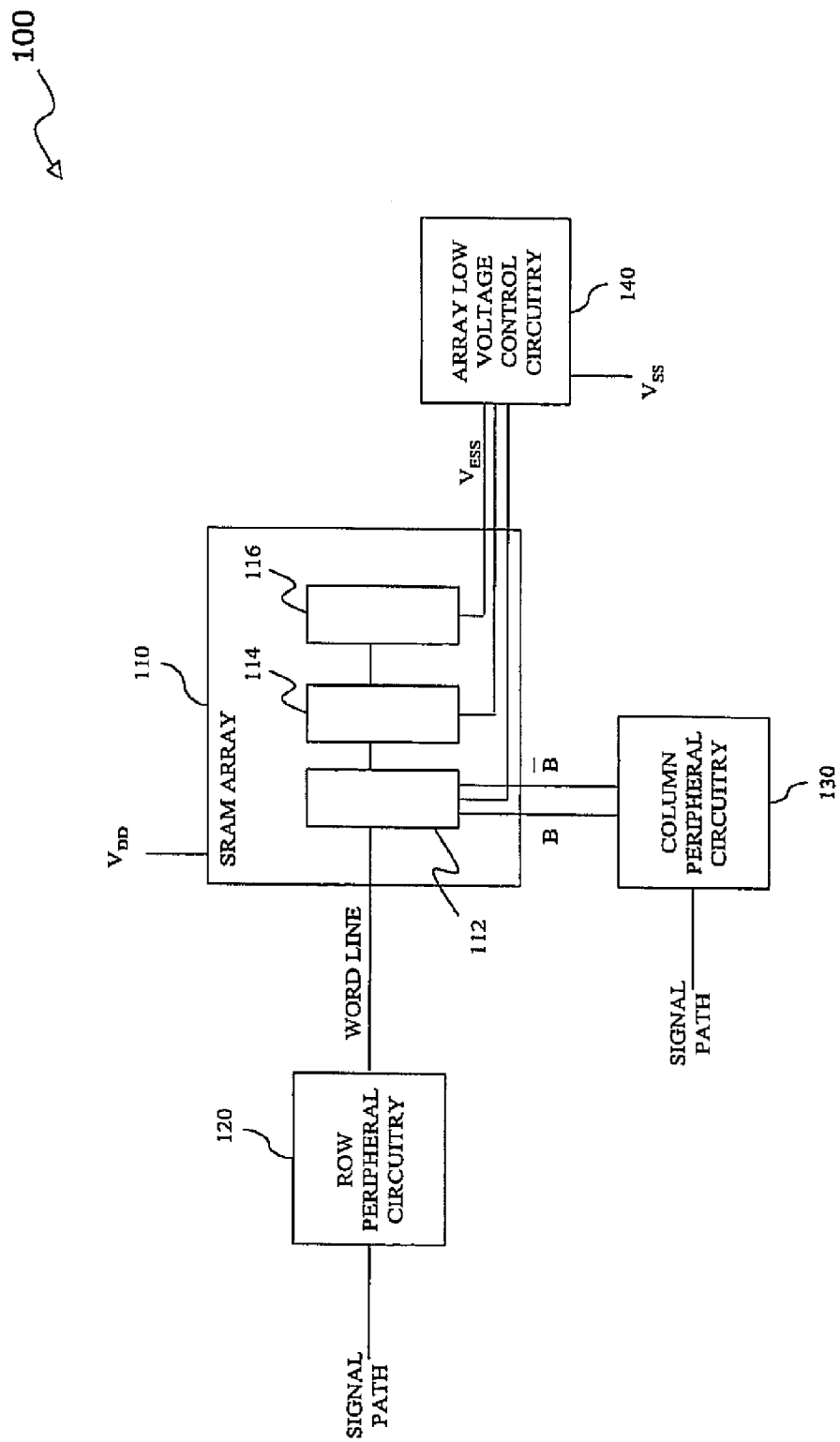
FIG. 1 illustrates a circuit diagram of an embodiment of an SRAM device constructed according to the principles of the present invention.

Referring initially to FIG. 1, illustrated is a circuit diagram of an embodiment of an SRAM device, generally designated 100, constructed according to the principles of the present invention. The SRAM device 100 includes an SRAM array 110, row peripheral circuitry 120, column peripheral circuitry 130 and an array low voltage control circuitry 140. Typically, the SRAM array 110 includes multiple memory cells organized in a matrix of columns and rows with corresponding multiple word lines and bit lines. For example, the SRAM array 110 may have 256 columns and 256 rows of memory cells. For ease of discussion, however, only a single row with a first, second and third column 112, 114, 116, of the SRAM array 110 are illustrated. Furthermore, only a single word line, bit line pair, row peripheral circuitry 120 and column peripheral circuitry 130 associated with the first column 112 are illustrated and discussed. One skilled in the art, however, will understand that the illustrated and discussed word line, bit line pair, row peripheral circuitry 120 and column peripheral circuitry 130 associated with the first column 112 may functionally represent similar circuitry associated with the second and third columns 114, 116, as well as additional columns and rows not illustrated.

The SRAM device 100 may be a memory component for an associated microprocessor, digital signal processor (DSP), application-specific integrated-circuit (ASIC) or larger electronic apparatus. In some embodiments, more than one SRAM device 100 may comprise the memory component. An Integrated Circuit (IC) associated with the SRAM device 100 may supply a high operating voltage $V_{DD}$ and a low operating voltage $V_{SS}$, thereto. The high operating voltage $V_{DD}$ and the low operating voltage $V_{SS}$ may be chip supply voltages. Typically, signal paths and a data interface of the associated apparatus may be coupled to the SRAM device 100 to send address information and retrieve/send data for reading/writing the data to specific memory cells of the SRAM array 110. One skilled in the art will understand coupling of the SRAM device 100 to the associated apparatus.

Each of the first, second and third columns 112, 114, 116, may include memory cells in multiple rows having a unique address for writing and reading the data. Each of the memory cells may employ MOSFETs and a flip-flop to store the data as a one or a zero. Reading and writing of the data in the first column 112 may be controlled by the row peripheral circuitry 120 and the column peripheral circuitry 130.

The row peripheral circuitry 120 may control activating a word line associated with one of the rows. The row peripheral circuitry 120 may include, for example, a row pre-decoder, a row decoder, a word line driver and a keeper. The word line driver may activate the word line for reading or writing based on an address signal received via a row signal path and decoded by the row pre-decoder and the row decoder.

The column peripheral circuitry 130 controls selecting the columns of the SRAM array 110 for reading and writing. The column peripheral circuitry 130 may include, for example, pre-charge circuitry, write circuitry, a column multiplexer and a sense amplifier. Additionally, the column peripheral circuitry may include address decoders for determining memory cell locations within the SRAM array 110 and control circuitry for determining between writing or reading the data. The pre-charge circuitry, the write circuitry, the column multiplexer and the sense amplifier may facilitate reading and writing data to the correct column address that has been decoded. As with the row peripheral circuitry 130, the column peripheral circuitry 130 may also include additional components that facilitate writing and reading the data that are not illustrated or discussed herein.

The array low voltage control circuitry 140 may be configured to provide an enhanced low operating voltage, $V_{ESS}$, to the SRAM array 110 during at least a portion of an active mode of the SRAM array 110. Of course, the enhanced low operating voltage $V_{ESS}$ may be provided during all of the active mode. The array low voltage control circuitry 140 may employ active components to provide the enhanced low operating voltage $V_{ESS}$. For example, the array low voltage control circuitry 140 may include a diode-bridged footer to raise the low operating voltage $V_{SS}$ and provide the enhanced low operating voltage $V_{ESS}$ A footer may be a transistor positioned between the low operating voltage $V_{SS}$ and the SRAM device 100. Typically, the footer may be an n-channel MOSFET. The array low voltage control circuitry may be an element to provide a voltage drop between the array and a low operating voltage supply bus. For example, the array low voltage control circuitry may be a turned on transistor where the width of the turned on transistor determines the voltage drop. The array low voltage control circuitry 140 may also employ fuses to apply the enhanced low operating voltage $V_{ESS}$ or to select a particular value for the enhanced low operating voltage $V_{ESS}$. The fuses may be employed to select a particular enhanced low operating voltage $V_{ESS}$ value for a mode of operation, a value of the high operating voltage $V_{DD}$ or transistor parameters. Of course, the fuses may also be employed to select other enhanced low operating voltage $V_{ESS}$ values based on various factors.

Additionally, the array low voltage control circuitry 140 may employ other components such as ROM or a voltage regulator to provide the enhanced low operating voltage $V_{ESS}$. The array low voltage control circuitry 140 may also include logic circuitry to selectively provide the enhanced low operating voltage $V_{ESS}$ to the SRAM array 110 based on, for example, a WRITE operation, a READ operation, a test mode or a process corner. The logic circuitry may employ fuses or transistors to provide such selectivity. The logic circuitry may be an associated microprocessor that instructs selectivity of the array low voltage control circuitry 140.

In some embodiments, the array low voltage supply 140 may provide the enhanced low operating voltage $V_{ESS}$ only during a WRITE operation. In other embodiments, the array low voltage control circuitry 140 may provide the enhanced low operating voltage $V_{ESS}$ at a lower value during a READ operation than during a WRITE operation. The array low voltage control circuitry 140 may only provide the lower value for an addressed column of the SRAM array 110. For instance, the row peripheral circuitry 120 and the column peripheral circuitry 130 may indicate a READ operation at the selected word line of the first column 112. Accordingly, the array low voltage control circuitry 140 may provide the enhanced low operating voltage $V_{ESS}$ lower value to the first column 112 to improve the read current during the READ operation. In some embodiments, the enhanced low operating voltage $V_{ESS}$ lower value may be provided to an appropriate block of the SRAM array 110 instead of a column.

In other embodiments, the array low voltage supply 140 may provide the enhanced low operating voltage $V_{ESS}$ during all of the active mode. The array low voltage control circuitry 140 may also provide enhanced low operating voltage $V_{ESS}$ during all modes. For example, the array low voltage control circuitry 140 may provide the enhanced low operating voltage $V_{ESS}$ for standby and sleep modes, too.

The enhanced low operating voltage $V_{ESS}$ may be provided based on characteristics of the SRAM device 100 transistors. For example, the array low voltage control circuitry 140 may provide the enhanced low operating voltage $V_{ESS}$ based on a process corner. The array low voltage control circuitry 140 may provide the enhanced low operating voltage $V_{ESS}$ at a higher value when based on a strong n process corner. In other embodiments, the array low voltage control circuitry 140 may provide the enhanced low operating voltage $V_{ESS}$ based on factors such as a mode of operation or a value of a high operating voltage $V_{DD}$.

Figure 2:
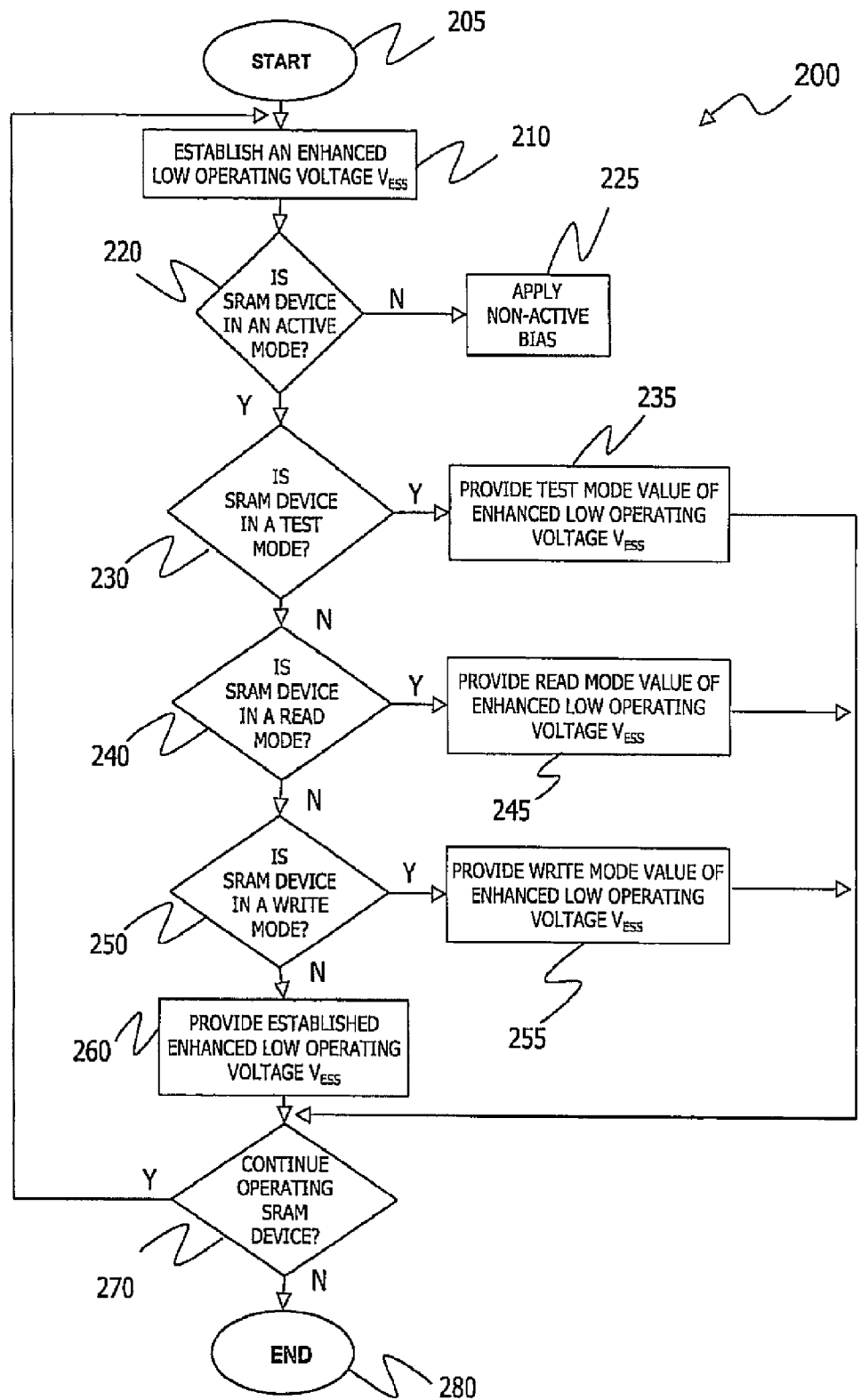
FIG. 2 illustrates an embodiment of a method of operating an SRAM device carried out according to the principals of the present invention.

Turning now to FIG. 2, illustrated is an embodiment of a method of operating an SRAM device, generally designated 200, carried out according to the principals of the present invention. The SRAM device has a SRAM array that may vary in size. For example, the SRAM array may have 256 columns and 256 rows of memory cells. The SRAM device may be employed in an Integrated Circuit (IC) that can include more than one SRAM array. Typically, the SRAM array is provided a low and high operating voltage, $V_{SS}$, $V_{DD}$, respectively. The low and high operating voltages $V_{SS}$, $V_{DD}$, may be chip supply voltages. The method 200 begins with a desire to operate the SRAM device in a step 205.

Next, an enhanced low operating voltage $V_{ESS}$ is established in a step 210. The enhanced low operating voltage $V_{ESS}$ may be established based on general characteristics of the SRAM device transistors. In some embodiments, an established enhanced low operating voltage $V_{ESS}$, may be altered based on a process corner. For example, an established enhanced low operating voltage $V_{ESS}$ may be provided at a higher value when the process corner is a strong n corner. The established enhanced low operating voltage $V_{ESS}$ may also be altered based on the high operating voltage $V_{DD}$ or temperature of the SRAM device. In some embodiments, however, the enhanced low operating voltage $V_{ESS}$ may be independent of the high operating voltage $V_{DD}$ or temperature. Thus, the value of the enhanced low operating voltage $V_{ESS}$ may vary based on, for example, the process corner, the high operating voltage $V_{DD}$ or temperature.

If the transistors do have a strong n process corner, then the enhanced low operating voltage $V_{ESS}$ may be provided at a higher value compared to transistors that are not at a strong n process corner. In other embodiments, the enhanced low operating voltage $V_{ESS}$ may be provided at a higher value based on other transistor characteristics, such as, a weak p characteristic of the SRAM array transistors. For example, the enhanced low operating voltage $V_{ESS}$ may be provided at about 0.1 volts higher based on transistor characteristics. In some embodiments, the enhanced low operating voltage $V_{ESS}$ may be provided at an even higher value if a lower value of the enhanced low operating voltage $V_{ESS}$ is provided to addressed columns during a READ operation.

Different voltage values, therefore, of the enhanced low operating voltage $V_{ESS}$ may be established for various operations. For example, one enhanced low operating voltage $V_{ESS}$ value may be established for a test operation. Additionally, different enhanced low operating voltage $V_{ESS}$ values may be established for a READ operation or a WRITE operation. In some embodiments, a single enhanced low operating voltage $V_{ESS}$ value may be employed for more than one type of operation.

After establishing the enhanced low operating voltage $V_{ESS}$, a determination is made if the SRAM device is in an active mode in a first decisional step 220. The SRAM device may be in the active mode during a WRITE or READ operation. Logic circuitry, such as a microprocessor, associated with the IC may determine when a WRITE or READ operation occurs. Additionally, column and row peripheral circuitry may indicate a READ or WRITE operation.

If the SRAM device is not in an active mode, then a non-active bias is applied to the SRAM array in a step 225. If not in the active mode, the SRAM device may be in a standby mode or in a sleep mode. The non-active bias may be a low power bias designed to lower the high operating voltage $V_{DD}$ or raise the low operating voltage $V_{SS}$ to assist in retaining data during a non-active state. Optionally, the enhanced low operating voltage $V_{ESS}$ may be applied to the SRAM array during the non-active state. In some embodiments, an array low voltage control circuitry may provide the non-active bias or the enhanced low operating voltage $V_{ESS}$. After applying the non-active bias, the method 200 continues to a step 270.

Returning now to the first decisional step 220, if the SPAM device is in the active mode, a determination is made if the SRAM device is in a test mode in a second decisional step 230. The logic circuitry associated with the IC may determine if the SRAM device is in the test mode. If the SRAM device is in the test mode, then the enhanced low operating voltage $V_{ESS}$ test mode value is provided to the SRAM device in a step 235. The test mode value of the enhanced low operating voltage $V_{ESS}$ may be provided by the array low voltage control circuitry. In some embodiments, the enhanced low operating voltage $V_{ESS}$ test mode value may be equivalent to the established enhanced low operating voltage $V_{ESS}$. After providing the enhanced low operating voltage $V_{ESS}$ test mode value, the method 200 continues to step 270.

If the SRAM device is not in the test mode, then a determination is made if the SRAM device is in a READ mode in a third decisional step 240. Associated logic circuitry may determine if the SRAM device is performing a READ operation. If in the READ mode, an enhanced low operating voltage $V_{ESS}$ READ mode value is provided to the SRAM array in a step 245. The READ mode value may be provided by the array low voltage control circuitry. In some embodiments, the READ mode value may only be provided to a portion of the SRAM array. For example, an addressed column of the SRAM array may be the only portion of the SRAM array in which the READ mode is provided. In other embodiments, a block of the SRAM array may be provided the READ mode value during a READ operation. The enhanced low operating voltage $V_{ESS}$ READ mode value may be about the value of the low operating voltage $V_{SS}$. After providing the enhanced low operating voltage $V_{ESS}$ READ mode value, the method 200 continues to step 270.

If the SRAM device is not in the READ mode, then a determination is made if the SRAM device is in a WRITE mode in a fourth decisional step 250. Associated logic circuitry may determine if the SRAM device is performing a WRITE operation. If in the WRITE mode, an enhanced low operating voltage $V_{ESS}$ WRITE mode value is provided to the SRAM array in a step 255. The WRITE mode value may be provided by the array low voltage control circuitry. After providing the enhanced low operating voltage $V_{ESS}$ WRITE mode value, the method 200 continues to step 270.

If the SRAM device is not in the WRITE mode, then the enhanced low operating voltage $V_{ESS}$ is provided to the SRAM array in a step 260. The enhanced low operating voltage $V_{ESS}$ may be provided by an array low voltage control circuitry. The enhanced low operating voltage $V_{ESS}$ may provide a lower voltage across the SRAM array during the active mode to reduce leakage current while maintaining an adequate SNM and $V_{trip}$. The enhanced low operating voltage $V_{ESS}$ may be provided by increasing the low operating voltage $V_{SS}$ employing the array low voltage control circuitry. The enhanced low operating voltage $V_{ESS}$ may be provided by employing active components such as a diode-bridged footer. Of course one skilled in the art will also understand that the enhanced low operating voltage $V_{ESS}$ may be provided by employing other active components or passive components. For example, the enhanced low operating voltage $V_{ESS}$ may be provided by employing a resistor, a transistor, a diode, a low drop-out regulator or a combination thereof. In some embodiments, the enhanced low operating voltage $V_{ESS}$ may be at about 0.2 volts. In other embodiments, the enhanced low operating voltage $V_{ESS}$ may be at about the low operating voltage $V_{SS}$.

After providing the enhanced low operating voltage $V_{ESS}$, a determination is made to continue operating the SRAM device in the fifth decisional step 270. If operating the SRAM device continues, then the method proceeds to step 210 and continues as described above. One skilled in the art will also understand that the high operating voltage $V_{DD}$ may also be maintained to the SRAM array while operating. In some embodiments, the high operating voltage $V_{DD}$ may be about 1.2 volts and the low operating voltage $V_{SS}$ may be about 0.0 volts. If operating the SRAM device does not continue, then the method ends in a step 280.

While the methods disclosed herein have been described and shown with reference to particular steps performed in a particular order, it will be understood that these steps may be combined, subdivided or reordered to form an equivalent method without departing from the teachings of the present invention. Accordingly, unless specifically indicated herein, the order and/or the grouping of the steps are not limitations of the present invention.

Although the present invention has been described in detail, those skilled in the art should understand that they can make various changes, substitutions and alterations herein without departing from the spirit and scope of the invention in its broadest form. For example, the SRAM array may be at an enhanced low operating voltage $V_{ESS}$ during all modes, such as, the standby and sleep mode. Additionally, SRAM array may be provided the enhanced low operating voltage $V_{ESS}$ only during a WRITE operation. While in other embodiments, the enhanced low operating voltage $V_{ESS}$ may be provided to the SRAM array during all of the active mode.

What is claimed is:

1. An SRAM device, comprising:
    an SRAM array including a plurality of individual SRAM cells, each cell coupled to row peripheral circuitry by a word line, to column peripheral circuitry by bit lines, and to a low operating voltage node, said SRAM array coupled to a high operating voltage node; and
    an array low voltage control circuitry that provides an enhanced low operating voltage $V_{ESS}$ to said low operating voltage node of said SRAM cells of the SRAM array during at least a portion of a READ operation or a WRITE operation thereof, said enhanced low operating voltage $V_{ESS}$ selectively adjusted to a distinct value according to device factors and having a higher value than a low operating voltage $V_{SS}$.

2. The SRAM device as recited in claim 1 wherein array low voltage control circuitry provides said enhanced low operating voltage $V_{ESS}$ based on a factor selected from the group consisting of:
    a process corner,
    a transistor parameter,
    a mode of operation, and
    a value of a high supply voltage.

3. The SRAM device as recited in claim 1 wherein said array low voltage control circuitry employs an active component to provide said enhanced low operating voltage $V_{ESS}$.

4. The SRAM device as recited in claim 1 wherein said array low voltage control circuitry provides said enhanced low operating voltage $V_{ESS}$ employing a component selected from the group consisting of:
    a diode,
    a transistor,
    a fuse,
    a ROM,
    a voltage regulator, and
    logic circuitry.

5. The SRAM device as recited in claim 2 wherein the value of $V_{ESS}$ is based on modes of operation including at least two of an active mode, a standby mode, and a sleep mode.

6. The SRAM device as recited in claim 1 wherein the SRAM array is embedded in a microprocessor integrated circuit.

7. The SRAM device as recited in claim 1 where the array low voltage control circuitry provides said enhanced low operating voltage $V_{ESS}$ to the low operating voltage node of said SRAM cells of the SRAM array at a lower value during said READ operation than during said WRITE operation.

8. The SRAM device as recited in claim 1 where the array low voltage control circuitry provides said enhanced low operating voltage $V_{ESS}$ to the low operating voltage node of said SRAM cells of the SRAM array during said READ operation and wherein the enhanced low operating voltage provided to the low operating voltage node of addressed SRAM cells in a column of the SRAM array during said READ operation is at a lower value than said enhanced low operating voltage provided to other non-addressed SRAM cells during said READ operation.

9. A method of operating an SRAM device, comprising:
employing in an integrated circuit an SRAM array, the SRAM array including a plurality of individual SRAM cells, each cell coupled to row peripheral circuitry by a word line, to column peripheral circuitry by bit lines, and to a low operating voltage node, said SRAM array coupled to a high operating voltage node; and providing an enhanced low operating voltage $V_{ESS}$ to said low operating voltage node of said SRAM cells of said SRAM array during at least a portion of an active mode, said enhanced low operating voltage $V_{ESS}$ selectively adjusted to a distinct value according to device factors and having a higher value than a low operating voltage $V_{SS}$.

10. The method as recited in claim 9 wherein said providing only occurs during a WRITE operation.

11. The method as recited in claim 9 wherein said providing occurs during all of said active mode.

12. The method as recited in claim 9 wherein said providing occurs during all modes.

13. The method as recited in claim 9 wherein said providing is based on a factor selected from the group consisting of:
a process corner,
a transistor parameter,
a mode of operation, and
a value of a high supply voltage.

14. The method as recited in claim 9 wherein said providing includes employing a component selected from the group consisting of:
a diode,
a transistor,
a fuse,
a ROM,
a voltage regulator, and
logic circuitry.

15. The method as recited in claim 13 wherein said providing is based on modes of operating including at least two of an active mode, a standby mode, and a sleep mode.

16. The method as recited in claim 9 wherein the enhanced low operating voltage $V_{ESS}$ is provided at a lower value during a READ operation than during a WRITE operation.

17. The method as recited in claim 9 wherein the enhanced low operating voltage $V_{ESS}$ is provided to the low operating voltage node of addressed SRAM cells in a column of the SRAM array during a READ operation at a lower voltage than said enhanced low operating voltage provided to other non-addressed SRAM cells during said READ operation.

18. An integrated circuit including an SRAM device, the SRAM device comprising:
an SRAM array including a plurality of individual SRAM cells each coupled to row peripheral circuitry by a word line, to column peripheral circuitry by bit lines, and to a low operating voltage node, the SRAM array further coupled to a high operating voltage node; and
an array low voltage control circuitry that selectively allows at least a first enhanced low operating voltage and a second enhanced low operating voltage higher than the first enhanced low operating voltage to be generated on said low operating voltage node of said SRAM cells of the SRAM array said first and second enhanced low operating voltages being higher in value than a low operating voltage $V_{SS}$, and wherein during a first mode of operation the low operating voltage $V_{SS}$ is provided to the low operating voltage node of said SRAM cells of the SRAM array, during a second mode of operation, different from the first mode of operation, the first enhanced low operating voltage is provided to the low operating voltage node of said SRAM cells of the SRAM array, and during a third mode of operation, different from the first and second modes of operation, the second enhanced low operating voltage is provided to the low operating voltage node of said SRAM cells of the SRAM array.

19. The SRAM device as recited in claim 18 wherein one of the modes of operation is an active mode and another of the modes of operation is one of a standby mode and a sleep mode of operation.

20. The SRAM device as recited in of claim 18 wherein one of the modes of operation is an active mode, and another of the modes is a test mode of operation.

21. The SRAM device as recited in claim 18 wherein said array low voltage control circuit employs an active component to provide said enhanced low operating voltages.

22. The SRAM device as recited in claim 18 wherein said SRAM array is embedded in a microprocessor integrated circuit.

23. The SNAM device as recited in claim 18 including a high operating voltage ($V_{DD}$) applied to the high operating voltage node and wherein a reduced high operating voltage, lower than the high operating voltage, is applied to the high operating voltage node during at least one mode of operation.

24. The SRAM device as recited in claim 19 including a high operating voltage ($V_{DD}$) applied to the high operating voltage node and wherein a reduced high operating voltage, lower than the high operating voltage, is applied to the high operating voltage node during a non-active mode of operation.

25. An integrated circuit including an SRAM device, the SRAM device comprising:
an SRAM array including a plurality of individual SRAM cells each coupled to row peripheral circuitry by a word line, to column peripheral circuitry by bit lines, and to a low operating voltage node, the SRAM array further coupled to a high operating voltage node; and
an array low voltage control circuitry that selectively allows an enhanced low operating voltage ($V_{ESS}$) to be generated on said low operating voltage node of said SRAM cells of the SRAM array during at least one mode of operation thereof, said enhanced low operating voltages ($V_{ESS}$) having a higher value than a low operating voltage $V_{SS}$, and during at least one mode of operation, the low operating voltage $V_{SS}$ is provided to the low operating voltage node of said SRM cells of the SRAM array, and wherein the array low voltage control circuitry provides said enhanced low operating voltage $V_{ESS}$ to the low operating voltage node of said SRAM cells of the SRAM array during a READ operation and wherein the enhanced low operating voltage provided to the low operating voltage node of addressed SRAM cells in a column of the SRAM array during said READ operation is at a lower value than said enhanced low operating voltage provided to other non-addressed SRAM cells during said READ operation.

* * * * *